United States Patent [19]
Yoshino

[11] Patent Number: 5,984,541
[45] Date of Patent: Nov. 16, 1999

[54] RESIST PROCESSING SYSTEM

[75] Inventor: Hiroshi Yoshino, Tokyo, Japan

[73] Assignee: NEC Corporation, Tokyo, Japan

[21] Appl. No.: 09/083,098

[22] Filed: May 22, 1998

[30] Foreign Application Priority Data

May 23, 1997 [JP] Japan ................................. 9-133149

[51] Int. Cl.$^6$ .............................. G03D 5/00; G03F 7/30; H01L 21/70; B01D 35/01
[52] U.S. Cl. ...................... 396/611; 422/255; 55/350.1; 55/472; 396/565
[58] Field of Search .................................. 396/604, 611, 396/627; 118/52, 302, 724, 730; 422/255; 55/350.1, 472; 134/84, 110, 902

[56] References Cited

FOREIGN PATENT DOCUMENTS 6-208947 7/1994 Japan .
7-142312 6/1995 Japan .

*Primary Examiner*—D. Rutledge
*Attorney, Agent, or Firm*—Foley & Lardner

[57] ABSTRACT

A resist processing system comprising a resist processing chamber 11, an air filter 14 and an air intake unit 15 for introducing air into the processing chamber 11 through the air filter 14, the air filter 14 having a housing 18 and a diffusion scrubber 19 separating a first space and a second space within the housing 18, the first space having a liquid inlet port 21A and a liquid outlet port 21B for passing a liquid therethrough, the second space having an air inlet port 20A and an air outlet port 20B for passing the air from the air intake unit therethrough.

9 Claims, 4 Drawing Sheets

RESIST PROCESSING SYSTEM

BACKGROUND OF THE INVENTION (a) Field of the Invention

The present invention relates to a resist processing system and, more particularly, to an air filter of a resist processing system for forming a resist film pattern for use in etching or ion implantation process.

(b) Description of the Related Art

Higher integration and operational speed of semiconductor devices are resulting from advance of higher resolution of optical lithography. Conventionally, g-line lithography in 0.436 nm wavelength is used for semiconductor devices in design rule more than 0.5 $\mu$m, and i-line lithography in 0.365 $\mu$m wavelength is used for semiconductor devices in design rules between 0.5~0.35 $\mu$m. KrF excimar laser lithography in 0.248 $\mu$m wavelength is used for semiconductor devices in their design rules in 0.30~0.20 $\mu$m.

A positive type resist such as Novolak resin and Naphthoquinonediazide (NQD) compound are widely used for i-line and g-line lithography. The positive type resist is, however, not applicable for KrF excimar laser lithography because the light absorption rate of Novolak resin is too large against KrF excimar laser having 248 nm wavelength. Resist sidewall will not be formed in a vertical profile and a low illumination of KrF excimar laser requires a resist having a higher sensitivity than conventional resists.

In view of the above, chemically amplified resists are developed for KrF excimar laser lithography. The chemically amplified resist comprises a base resin, an acid generator for generating acid during exposure thereof, and a compound having a reactive radical exhibiting variable dissolution in developer solvent depending on acidity. As a base resin, a phenol-based resin is mainly used which has a high penetration rate for KrF excimar laser having 248 nm wavelength. Acid catalyzer in the chemically amplified resist accelerates chemical reactions for higher sensitivity suitable for a smaller design rule than conventional resists.

It is known that performance of the chemically amplified resists depends on resist processing environment for forming a pattern. For example, the top portion of resist is often formed in a poor sidewall profile such as T-tops when a positive type chemically amplified resist is used because function of the acid catalyzer is impaired by airborne acid contaminants to retard dissolution of the top of the resist.

In an extreme case, adjacent patterns are often bridged together resulting in difficulty in etching the underlying layer.

Patent Publication No. JP-A-06 (1994)-208947 describes that an air filter comprising acid substances reduces by filtering alkali contaminants in a resist processing environment for using chemically amplified resist. Although this method is effective for removing alkali contaminants, replacement of the air filter is required, which lowers productivity of the semiconductor fabrication and causes cost increase. In addition, timing of the air filter replacement is difficult to determine unless processing environment is monitored by an expensive monitor.

Patent Publication No. JP-A-07 (1995)-142312 describes a neutralization reaction chamber wherein airborne alkali contaminants are filtered by either acid gas or acid solution. Although this method may also be effective for neutralizing airborne alkali contaminants, it is difficult to obtain an accurate neutral condition because acidity in the processing environment fluctuates depending on airborne alkali levels.

For example, if the concentration of the acid gas is adjusted to a high level of airborne alkali, the acidity in the processing environment becomes higher when airborne alkalinity is lower. Under this condition, the resist film will be thin in the case of a positive type resist, T-tops sidewall profile will be formed in the case of a negative type resist. A similar problem will arise in a method using the acid solution.

A known air purification equipment comprises an air filter having a combination of a wet scrubber and a dry filter. The wet scrubber uses a water sprinkler for sprinkling water from the top thereof for air purification. This method is targeted at the removal of sodium (Na) and may be used for removal of alkali contaminants. The increase of humidity within the processing environment, however, causes a problem. After alkali contaminants are neutralized, a drying process is required to control the humidity of the processing environment by using a dryer, which causes to make the air filter apparatus larger and equipment cost higher.

As described above, conventional techniques do not provide a long life, simple means for removing airborne alkali contaminants.

SUMMARY OF THE INVENTION

It is therefore an object of the present invention to provide a long life, simple resist processing system for removing airborne contaminants.

The present invention provides a resist processing system comprising a resist processing chamber, an air filter and an air intake unit for introducing air into the processing chamber through the air filter, the air filter having a housing and a diffusion scrubber separating a first space and a second space within the housing, the first space having a liquid inlet port and a liquid outlet port for passing a liquid therethrough, the second space having an air inlet port and an air outlet port for passing the air from the air intake unit therethrough.

Chemically amplified resist formed on a wafer generates acid during laser exposure. The chemically amplified resist requires heating process for accelerating the reaction of the resist with acid catalyzer. If the resist processing environment is polluted by alkali contaminants, the function of the acid catalyzer is impaired. The environment is most influenced during the steps from exposure to heating. A better patterning is obtained by removing the alkali contaminants from the processing environment while wafers are transported between the exposure chamber to the heating chamber, according to the present invention.

Pure water or an acid solution circulating through a diffusion scrubber tube adsorbs airborne alkali contaminants easily without increasing humidity and acidity within the processing environment.

It is most effective by removing the alkali contaminants throughout the process including resist application, exposure, heating and development steps.

The above and other objects, features and advantages of the present invention will be more apparent from the following description, referring to the accompanying drawings.

DESCRIPTION OF THE PREFERRED EMBODIMENTS

Now, the present invention is more specifically described with reference to the accompanying drawings.

Figure 1:
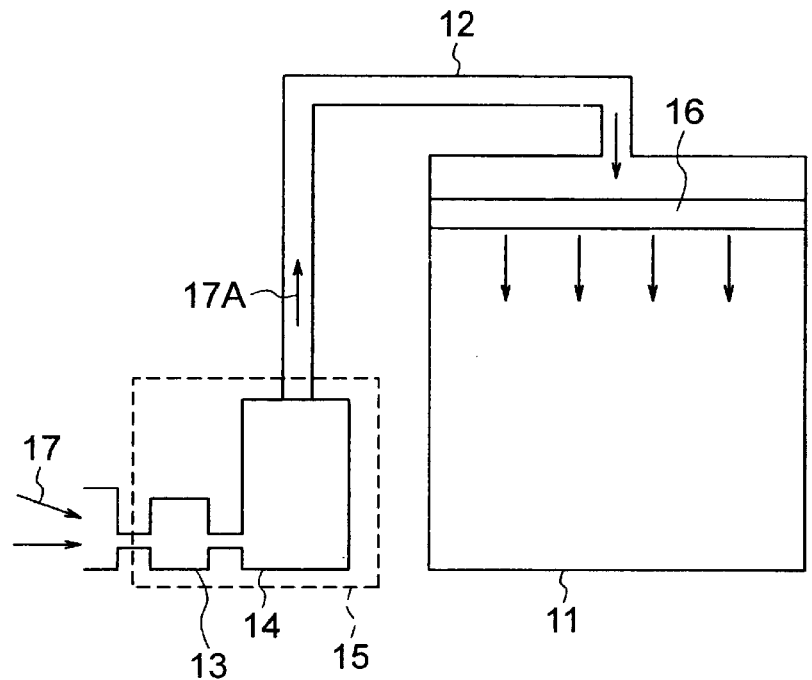
FIG. 1 is a schematic side-view of a resist processing system according to a first embodiment of the present invention.

Referring to FIG. 1, a resist processing system 10 according to a first embodiment of the present invention comprises a resist processing chamber 11 for receiving semiconductor wafers during a resist processing step, which may be one of resist coating, exposure and development steps, an air intake unit 15 for supplying air 17 into the resist processing chamber 11 through an air supply pipe 12 and a dust filter 16. The air intake unit 15 comprises an air intake device or fan 13 and an air filter 14.

Figure 2:
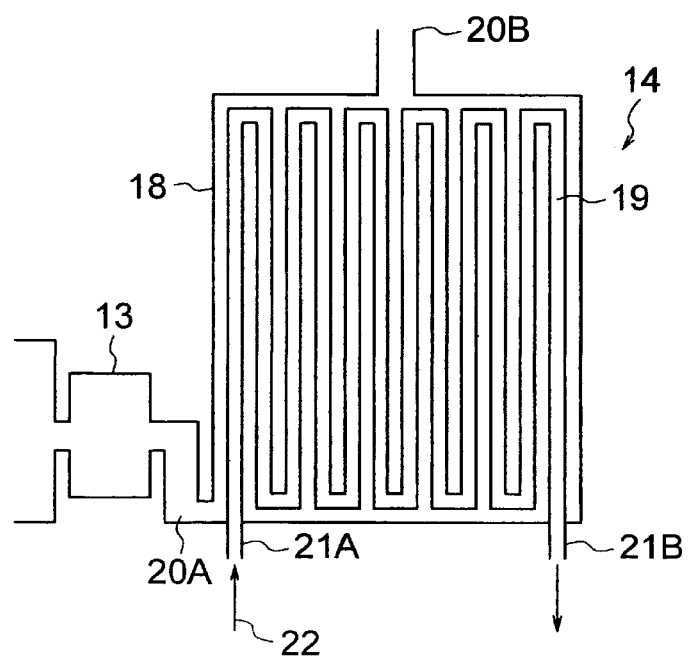
FIG. 2 is a detailed view of an air filter in the resist patterning system of FIG. 1.

Referring to FIG. 2, the air filter 14 comprises a housing 18 having an air inlet port 20A and an air outlet port 20B and a diffusion scrubber tube 19 installed within the housing 18. A fluid inlet port 21A is provided for the diffusion scrubber tube 19 installed in the housing 18 for taking pure water 22 into the diffusion scrubber tube 19 for removal of airborne contaminants. The pure water 22 drains from a fluid outlet port 21B after adsorbing the airborne contaminants.

In operation, the air intake device 13 supplies air 17 into the resist processing chamber 11 through the air filter 14 which removes airborne contaminants from the air and the dust filter 16 which removes airborne dust. The resist processing chamber 11 is used for heating and development of the resist film after the resist film is exposed to light.

Figure 3:
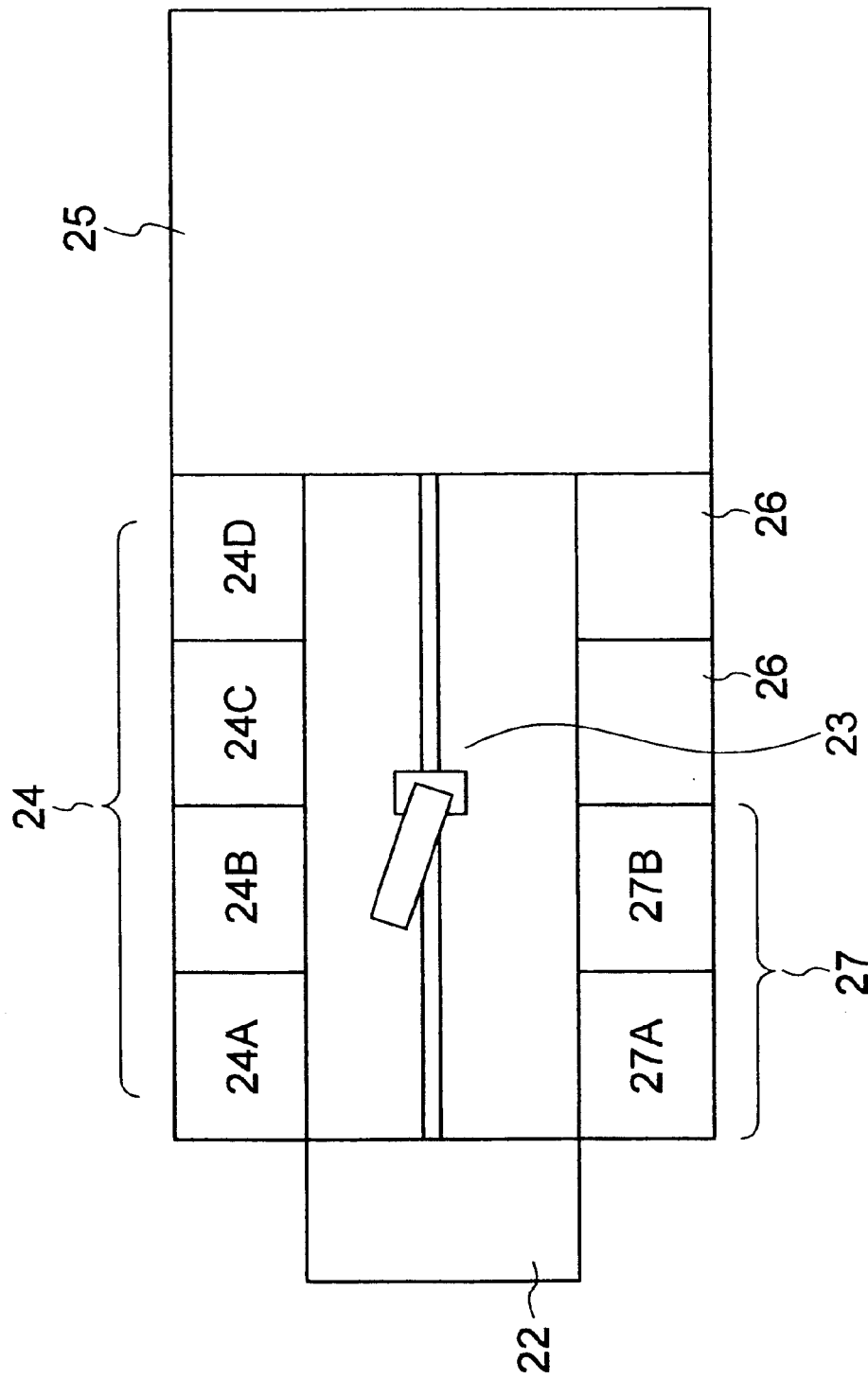
FIG. 3 is a schematic layout of a resist patterning system of FIG. 1.

FIG. 3 shows a schematic layout of a plurality of resist processing chambers. The resist processing chamber 11 described above may be any of resist coating chambers 24, an exposure chamber 25, heating chambers 26 and development chambers 27 shown in FIG. 3. For carrying wafers between the resist processing chambers, a loading chamber 22 and a carrier 23 are used to carry the wafers between adjacent chambers. The resist coating chambers include a dehydration chamber 24A, a cooling chamber 24B, a spinner chamber 24C and a pre-baking chamber 24D. The development chambers include a developing chamber 27A and a cooling chamber 27B.

The diffusion scrubber tube 19 is made from polytetrafluoroethylene (Teflon) or equivalent materials having similar properties, with an internal/external diameters in a few millimeters and a length of about 1 m. Some hundreds of such diffusion scrubber tubes 19 are bundled together with an air flow spacing one another and installed in the air filter 14. When a length of the diffusion scrubber tube 19 is longer than 1 m, a smaller number of such diffusion scrubber tubes 19 can be bundled for keeping a similar performance depending on a proportion between the length and the number of bundled tubes. Both ends of the bundled diffusion scrubber tubes are connected to the fluid intake inlet port 21A and the fluid outlet port 21B disposed on the housing 18. Pure water 22 is supplied into the diffusion scrubber tube 19. The diffusion scrubber tube 19 has a wall having a function for passing gas therethrough while blocking fluid similar to a function commercially known as Goretex. While air flows through the external spacing between the diffusion scrubber tubes within the housing 18, airborne water-soluble contaminants are adsorbed into the pure water 22 by the function of the diffusion scrubber tube 19. Accordingly, the air is purified and supplied through the air supply pipe 12 to the resist processing chamber 11. Purified air 17A flowing into the dust filter 16 is filtered and supplied to the resist processing chamber 11.

The density of ammonia ($NH_3$) is considered to be a key influential contaminant against chemically amplified resist. For testing purpose, the density of ammonia is measured after the air is purified by the air filter 14 and the dust filter 16. The measured density of ammonia was 0.5 ppm in the resist processing chamber 11 and was 12 ppm in the ambient air. Liquid ion chromatography was used for the measurement of ammonia, after the contaminants were collected by the Impinger method. The test results proved that the air filter of the first embodiment of the present invention performed effectively for the removal of contaminants. The humidity was 41% in the resist processing chamber 11 within a satisfactory level for practical use and was 40% in the ambient air.

Figure 4A:
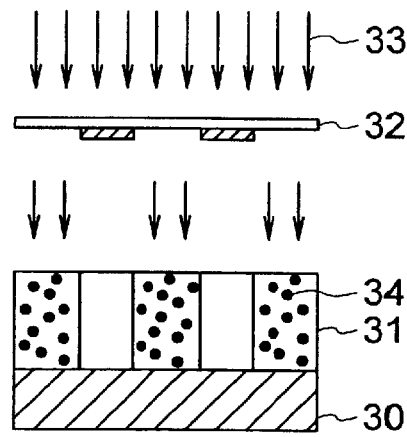
FIGS. 4A, 4B and 4C are sectional views of a semiconductor wafer during consecutive resist processing steps for patterning a resist.
Figure 4B:
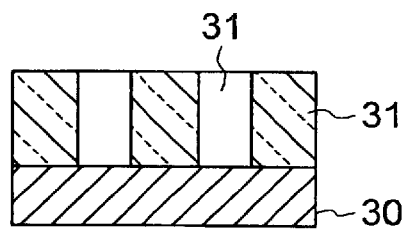
Figure 4C:
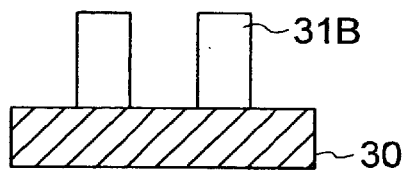

FIGS. 4A, 4B and 4C are sectional views of a semiconductor wafer during consecutive steps for processing resist to form a resist pattern. In FIG. 4A, the KrF excimar laser stepper irradiates laser light 33 through a mask 32 onto a positive type chemically amplified resist film 31 formed on a substrate 30. As a result of the exposure, acid 34 was generated within the exposed area of the resist film 31.

In FIG. 4B, the resist film 31 was thermally treated in the resist processing chamber. The exposed area of the resist film 31 reacted under the presence of the acid catalyzer to become a soluble area 31A which was capable of dissolving to a developer solvent. In FIG. 4C, an excellent resist pattern is formed after a developer process in the development chamber of the resist processing system.

Figure 5A:
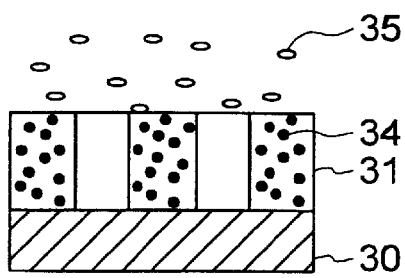
FIGS. 5A and 5B are sectional views of a semiconductor wafer during consecutive resist processing steps for patterning a resist; and, FIG. 6 is a schematic side-view of a resist processing system according to a second embodiment of the present invention.
Figure 5B:
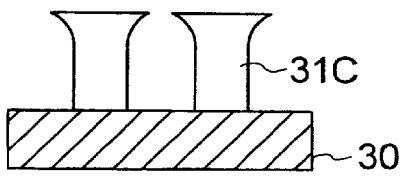

On the other hand, as shown in FIG. 5A, when a resist film was heated after exposure without the removal of airborne contaminants by the air filter, acid generated within the exposed area of the resist and airborne alkali contaminants in the resist processing chamber are neutralized to form a top poor-soluble layer, which retarded dissolution of the exposed area in the developer solvent. In FIG. 5B, T-tops resist 31C was formed after the resultant resist was developed in the development chamber.

The resist processing system of the present invention proved as an effective method suitable for the process using chemically amplified resist.

As an alternative to the pure water 22, approximately 0.1 normal nitric or phosphoric acid solution can be used for circulation in the diffusion scrubber tube 19.

Figure 6:
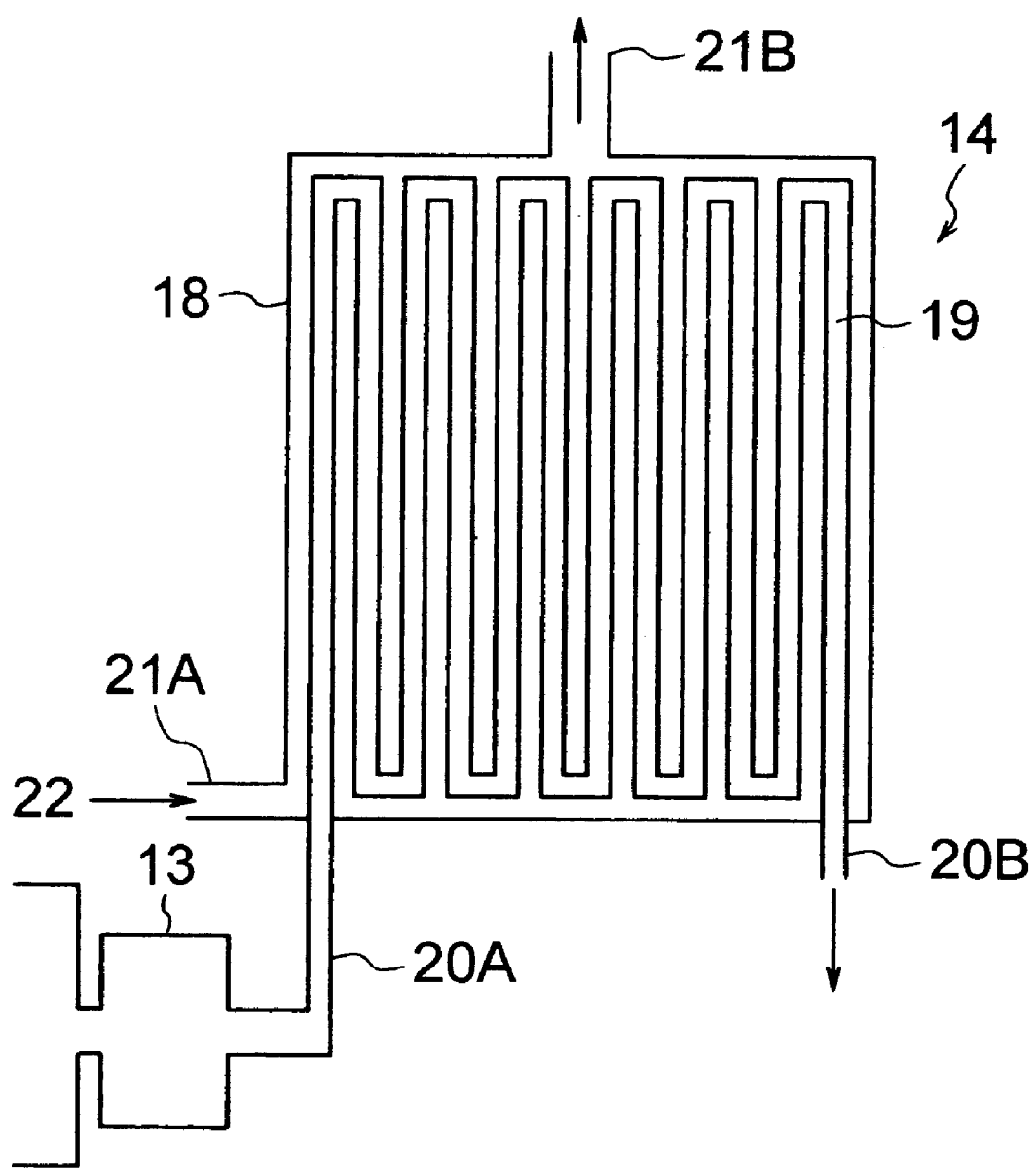

Referring to FIG. 6, there is shown a resist processing system according to a second embodiment of the present invention. The second embodiment is similar to the first embodiment except that air flows into the diffusion scrubber tube 19 whereas pure water flows outside the diffusion scrubber tube 19 in the housing 18. Other configuration is similar to the first embodiment and those detailed description of the second embodiment is omitted here by designating reference symbols to the constituent elements similar to the first embodiment.

Similar to the first embodiment, airborne contaminants are effectively removed by the second embodiment.

According to the embodiments of the present invention, a fine pattern is formed irrespective of fluctuation of contaminants in the ambient air by disposing the air filter having the scrubber tube for removing airborne contaminants.

Since the above embodiments are described only for examples, the present invention is not limited to the above embodiments and various modifications or alterations can be easily made therefrom by those skilled in the art without departing from the scope of the present invention.

What is claimed is:

1. A resist processing system comprising a resist processing chamber, an air filter and an air intake unit for introducing air into said processing chamber through said air filter, said air filter having a housing and a diffusion scrubber separating a first space and a second space within said housing, said first space having a liquid inlet port and a liquid outlet port for passing a liquid therethrough, said second space having an air inlet port and an air outlet port for passing the air from said air intake unit therethrough.

2. A resist processing system as defined in claim 1, wherein said diffusion scrubber is formed as a tube installed within said resist processing chamber and defining said first space within said tube.

3. A resist processing system as defined in claim 2 further comprising a dust filter disposed between said air intake unit and said second space.

4. A resist processing system as defined in claim 2, wherein said resist processing chamber is one of a resist application chamber, a resist heating chamber, a resist exposure chamber and a resist developing chamber.

5. A resist processing system as defined in claim 2, wherein water or acid solution is introduced into said first chamber as said liquid.

6. A resist processing system as defined in claim 1, wherein said diffusion scrubber is formed as a tube installed within said resist processing chamber and defining said second space within said tube.

7. A resist processing system as defined in claim 6 further comprising a dust filter disposed between said air intake unit and said second space.

8. A resist processing system as defined in claim 6, wherein said resist processing chamber is one of a resist application chamber, a resist heating chamber, a resist exposure chamber and a resist developing chamber.

9. A resist processing system as defined in claim 6, wherein water or acid solution is introduced into said first chamber through said liquid inlet tube as said liquid.

* * * * *